(12) United States Patent
Tsukihara et al.

(10) Patent No.: US 7,687,782 B2
(45) Date of Patent: Mar. 30, 2010

(54) ELECTROSTATIC BEAM DEFLECTION SCANNER AND BEAM DEFLECTION SCANNING METHOD

(75) Inventors: Mitsukuni Tsukihara, Ehime (JP); Mitsuaki Kabasawa, Ehime (JP); Yoshitaka Amano, Ehime (JP); Hiroshi Matsushita, Ehime (JP)

(73) Assignee: SEN Corporation, an SHI and Axcelis Company, Tokyo (JP)

( * ) Notice: Subject to any disclaimer, the term of this patent is extended or adjusted under 35 U.S.C. 154(b) by 146 days.

(21) Appl. No.: 11/806,127

(22) Filed: May 30, 2007

(65) Prior Publication Data

US 2008/0067404 A1 Mar. 20, 2008

(30) Foreign Application Priority Data

May 30, 2006 (JP) .............................. 2006-149281

(51) Int. Cl.
*G21K 1/087* (2006.01)
*H01J 3/18* (2006.01)

(52) U.S. Cl. ................................. 250/396 R; 250/492.1; 250/492.2; 250/492.3

(58) Field of Classification Search ............. 250/396 R, 250/397, 398, 492.1, 492.22, 493.1, 491.1, 250/492.2, 492.21, 492.3; 335/310; 210/335
See application file for complete search history.

(56) References Cited

U.S. PATENT DOCUMENTS 5,744,810 A 4/1998 Satoh 6,423,965 B1 * 7/2002 Hashimoto et al. .......... 250/288
2004/0135080 A1 * 7/2004 Ouyang et al. ............... 250/292
2006/0113468 A1 * 6/2006 Yagita ........................ 250/290
2006/0209008 A1 * 9/2006 Nihei et al. .................. 345/107

FOREIGN PATENT DOCUMENTS

| EP | 1 670 027 A2 | 6/2006 |
| JP | 06-215724 A | 8/1994 |
| JP | 10-64470 A | 3/1998 |
| JP | 2005-332776 | * 2/2005 |
| JP | 2005-332776 A | 12/2005 |

* cited by examiner

*Primary Examiner*—Jack I Berman
*Assistant Examiner*—Nicole Ippolito Rausch
(74) *Attorney, Agent, or Firm*—Arent Fox LLP

(57) ABSTRACT

A beam deflection scanner performs reciprocating deflection scanning with an ion beam or a charged particle beam to thereby periodically change a beam trajectory and comprises a pair of scanning electrodes installed so as to be opposed to each other with the beam trajectory interposed therebetween and a pair of correction electrodes installed in a direction perpendicular to an opposing direction of the pair of scanning electrodes, with the beam trajectory interposed therebetween, and extending along a beam traveling axis. Positive and negative potentials are alternately applied to the pair of scanning electrodes, while a correction voltage is constantly applied to the pair of correction electrodes. A correction electric field produced by the pair of correction electrodes is exerted on the ion beam or the charged particle beam passing between the pair of scanning electrodes at the time of switching between the positive and negative potentials.

15 Claims, 6 Drawing Sheets

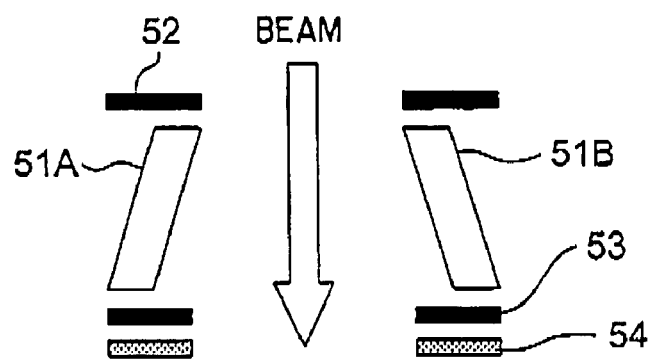
FIG. 1A
RELATED ART
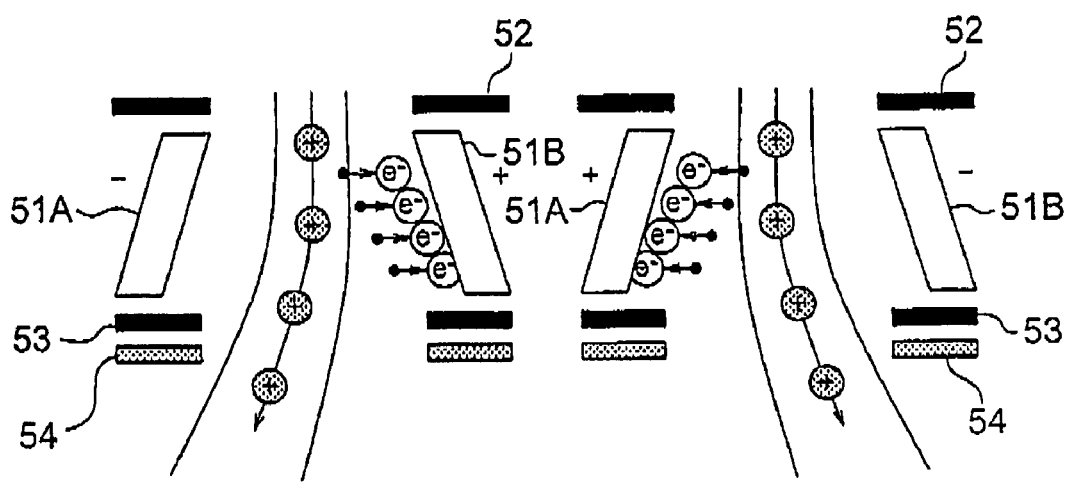
FIG. 1B
RELATED ART
FIG. 1C
RELATED ART
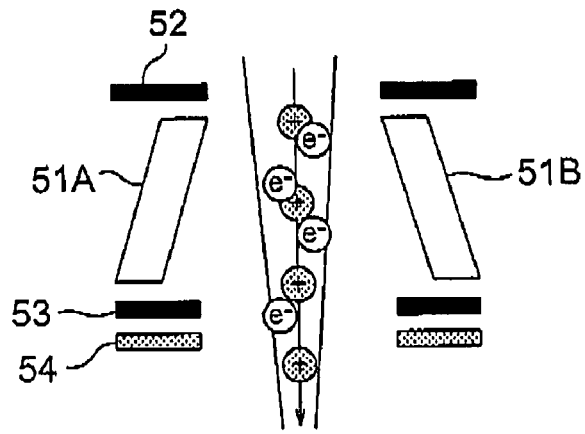
FIG. 1D
RELATED ART

ELECTROSTATIC BEAM DEFLECTION SCANNER AND BEAM DEFLECTION SCANNING METHOD

This application is based upon and claims the benefit of priority from Japanese patent application No. 2006-149281, filed on May 30, 2006, the disclosure of which is incorporated herein its entirety by reference.

BACKGROUND OF THE INVENTION

This invention relates to an electrostatic beam deflection scanner and beam deflection scanning method for use in a beam processing system using an ion beam or a charged particle beam. This invention is applied, for example, to an ion implantation system of the type that implants ions into a wafer by performing parallel scanning to the wafer with a high-current ion beam having low to intermediate energy. Particularly, this invention relates to improving the ion implantation uniformity in a scan direction by suppressing a zero electric field effect in an electrostatic beam defection scanner.

Referring to FIGS. 1A to 1D, a description will be given of the structure and operation of an electrostatic beam deflection scanner (hereinafter abbreviated as a "deflection scanner") applied to an ion implantation system, As shown in FIG. 1A, the deflection scanner has a pair of scanning electrodes 51A and 51B installed so as to be opposed to each other with an ion beam passing region interposed therebetween. Electron suppression electrodes 52 and 53 are installed on the upstream side (front side) and the downstream side (rear side) of the scanning electrodes 51A and 51B with respect to the beam traveling direction, respectively. The electron suppression electrodes 52 and 53 each have an opening in the ion beam passing region. A ground electrode 54 is installed adjacent to the downstream-side electron suppression electrode 53. As will be described later, the scanning electrodes 51A and 51B have mutually opposed electrode surfaces each having a circular-arc cross-sectional shape, Further, the interval between the mutually opposed electrode surfaces gradually increases as going from the upstream side to the downstream side.

An ion beam entering this type of deflection scanner is composed of cations of a required ion species and electrons attracted to these cations are attached to the ion beam.

The deflection scanner is electrically connected to a non-illustrated AC power supply and an AC voltage from the AC power supply is applied across the scanning electrodes 51A and 51B. Voltage application to the scanning electrodes 51A and 51B of the deflection scanner is roughly classified into the following three states.

1. As shown in FIG. 1B, a negative voltage is applied to the scanning electrode 51A, while a positive voltage is applied to the scanning electrode 51B.

2. As shown in FIG. 1C, a positive voltage is applied to the scanning electrode 51A, while a negative voltage is applied to the scanning electrode 51B.

3. As shown in FIG. 1D, the voltage is zero at both the scanning electrodes 51A and 51B. This represents a time when the positive and negative potentials applied to the scanning electrodes 51A and 51B are switched. In other words, by switching the positive and negative potentials applied to the scanning electrodes 51A and 51B at a constant period, an ion beam reciprocatingly scans a predetermined scan range at the constant period. This scan is called a parallel scan with electrostatic deflection using varying electric field.

In FIG. 1B, ions with positive charge passing through the deflection scanner are attracted to the left-side scanning electrode 51A having the negative voltage. On the other hand, electrons attached to an ion beam are attracted to the right-side scanning electrode 51B having the positive voltage. While passing through the deflection scanner, the ion beam loses the electrons and thus the ions with positive charge repulse each other due to the space-charge effect, so that the ion beam tends to diverge. Since the mass of an electron is smaller than that of an ion, the deflection angle of the electron is greater than that of the ion.

Also in FIG. 1C, for the same reason as in FIG. 1B, an ion beam tends to diverge while passing through the deflection scanner.

On the other hand, in FIG. 1D, since the voltage is zero at both the scanning electrodes 51A and 51B of the deflection scanner, an ion beam passes straight between the scanning electrodes 51A and 51B. Since electrons attracted to the ion beam also pass straight without being attracted to the scanning electrodes 51A and 51B, the ion beam passing through the deflection scanner tends to converge to some extent by the remaining electrons. This phenomenon is often called a zero electric field effect. This type of deflection scanner is disclosed, for example, in a document 1 (Japanese Unexamined Patent Application Publication (Tokuhyo) No. 2003-513419).

When the ion beam scans the scan range with the electrostatic deflection using the varying electric field as described above, there arises a problem that, as shown in FIG. 2A, the beam diameter becomes larger at end portions of the scan range than that at the central portion of the scan range on the downstream side of the deflection scanner. The beam diameter represents a cross-sectional size of the ion beam in a scan direction (indicated by arrows in FIG. 2A) in the reciprocating scan plane of the ion beam. The end portions of the scan range represent end portions near the scanning electrodes 51A and 51B in the reciprocating scan plane of the ion beam, while the central portion of the scan range represents a portion around the central axis in the reciprocating scan plane of the ion beam.

The above problem arises because the mass of each ion contained in the ion beam and that of each electron caught in the ion beam largely differ from each other and further because the repulsion force between the ions increases as the beam current density increases.

If the beam diameter of the ion beam changes in the process of the parallel scan with the electrostatic deflection as described above, the density of the ion beam increases when the ion beam passes through the scan range, so that the amount of ion implantation into a wafer increases, while, the density of the ion beam passing through the end portions of the scan range decreases due to divergence. As a result, the ion implantation uniformity in the wafer is degraded.

This problem commonly exists in ion implantation systems employing an electrostatic deflection scanner.

The Influence of such a problem is small in an ion implantation system using a high-energy ion beam or an ion implantation system using an intermediate-current ion beam. However, in an ion implantation system using a low-energy high-current ion beam, the ion implantation uniformity is degraded more significantly, which thus arises as a serious problem.

SUMMARY OF THE INVENTION

It is therefore an object of this invention to allow a beam diameter during scanning with electrostatic deflection to be maintained substantially constant regardless of a position in a scan range.

A beam deflection scanner according to the present invention performs reciprocating deflection scanning with varying electric field using an ion beam or a charged particle beam to thereby periodically change a beam trajectory. According to a first aspect of the present invention, the beam deflection scanner comprises a pair of scanning electrodes installed so as to be opposed to each other with the beam trajectory interposed therebetween and a pair of electric field correction electrodes installed in a direction perpendicular to an opposing direction of the pair of scanning electrodes, with the beam trajectory interposed therebetween, and extending along a beam traveling axis. The positive and negative potentials are alternately applied to the pair of scanning electrodes, while a correction voltage is constantly applied to the pair of electric field correction electrodes. A correction electric field produced by the pair of electric field correction electrodes is exerted on the ion beam or the charged particle beam passing between the pair of scanning electrodes at the time of switching between the positive and negative potentials.

A beam deflection scanning method according to the present invention performs reciprocating deflection scanning with varying electric field using an ion beam or a charged particle beam to thereby periodically change a beam trajectory. According to a second aspect of the present invention, the beam deflection scanning method comprises performing the reciprocating deflection scanning by switching between positive and negative potentials applied to a pair of scanning electrodes opposed to each other and exerting, at the time of switching between the positive and negative potentials, a correction electric field on the ion beam or the charged particle beam passing between the pair of scanning electrodes using a pair of electric field correction electrodes installed between the pair of scanning electrodes so as to be opposed to each other.

BRIEF DESCRIPTION OF THE DRAWINGS

FIGS. 1A to 1D are diagrams for explaining the operation of a beam deflection scanner in a related art of the present invention;

FIGS. 3A and 3B are diagrams showing a schematic structure of an ion implantation system to which this invention is applied, wherein FIG. 3A is a plan view and FIG. 3B is a side sectional view;

DESCRIPTION OF THE EXEMPLARY EMBODIMENTS

A description will be made in regard to an exemplary embodiment of the present invention.

Figure 3A:
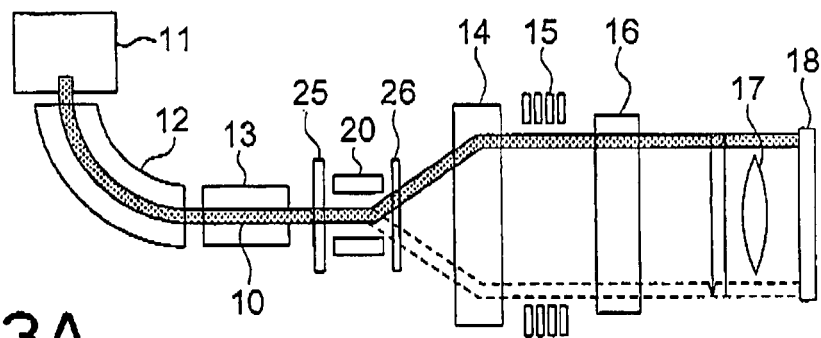
Figure 3B:
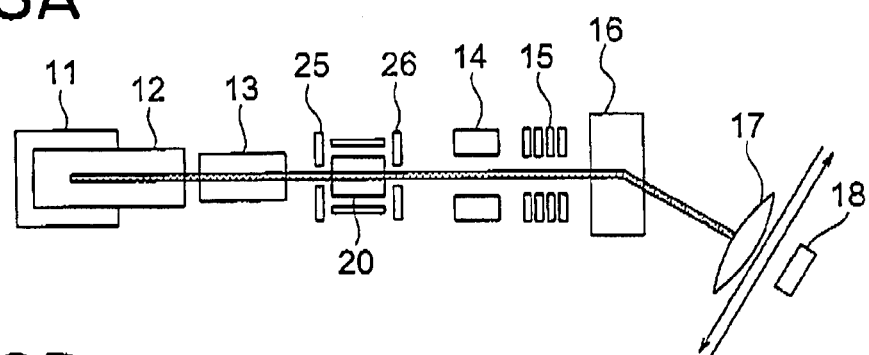

FIGS. 3A and 3B show an example in which a structure for carrying out a zero electric field effect suppression method according to this invention is added particularly to a single-wafer ion implantation system using a low-energy high-current ion beam, among those processing systems using a charged particle beam.

In FIGS. 3A and 3B, ions generated in an ion source 11 are extracted through a non-illustrated extraction electrode as an ion beam (hereinafter referred to as a "beam"), The extracted beam is subjected to a mass analysis in a mass analysis magnet device 12 so that a necessary ion species is selected. The beam composed of the necessary ion species is shaped into a required cross-sectional shape, herein an oval shape in cross-section, by a beam shaper 13. The beam shaper 13 is formed by a Q (Quadrupole)-lens and so on. The beam having the shaped cross-section performs parallel deflection scanning in a direction parallel to the sheet surface of FIG. 3A by a deflection scanner 20 according to this invention, The deflection scanner 20 comprises electron suppression electrodes 25 and 26 installed on the upstream side (front side) and the downstream side (rear side) thereof, respectively.

The deflected beam is parallelized again by a P (Parallel)-lens 14 so as to be parallel to an axis of a deflection angle of 0°. In FIG. 3A, a scan range of the beam 10 by the deflection scanner 20 is indicated by a thick black line and broken lines at the downstream side of the deflection scanner 20. The thick black line and the broken lines extending from the deflection scanner 20 can be defined as the maximum scan angle trajectories, respectively.

The beam from the P-lens 14 is sent to an angular energy filter 16 through one or more acceleration/deceleration electrodes 15. The angular energy filter 16 performs an analysis about energy of the beam to thereby select only an ion species with a necessary energy.

As shown in FIG. 3B, only the selected ion species is deflected slightly downward in the angular energy filter 16. The beam composed of the thus selected ion species is irradiated onto a semiconductor wafer 17 being an irradiation object. The beam that is not irradiated onto the semiconductor wafer 17 is incident on a beam stopper 18 so that energy thereof is consumed.

Normally, the structure from the ion source 11 to a chamber where the semiconductor wafer 17 is accommodated is called a beam line. The path of the beam is all maintained in a high-vacuum state and sealed from the air.

In FIG. 3A, two arrows shown adjacent to the semiconductor wafer 17 represent that the beam performs reciprocating deflection scanning (parallel scanning) within a range of these arrows. On the other hand, in FIG. 3B, two arrows shown adjacent to the semiconductor wafer 17 represent that the semiconductor wafer 17 is reciprocated within a range of these arrows. Specifically, assuming that, for example, the beam performs reciprocating deflection scanning in directions of one axis, the semiconductor wafer 17 is reciprocated in directions perpendicular to such directions of one-axis by a non-illustrated drive mechanism. This reciprocation of the semiconductor wafer 17 is also called a mechanical scan.

Figure 4:
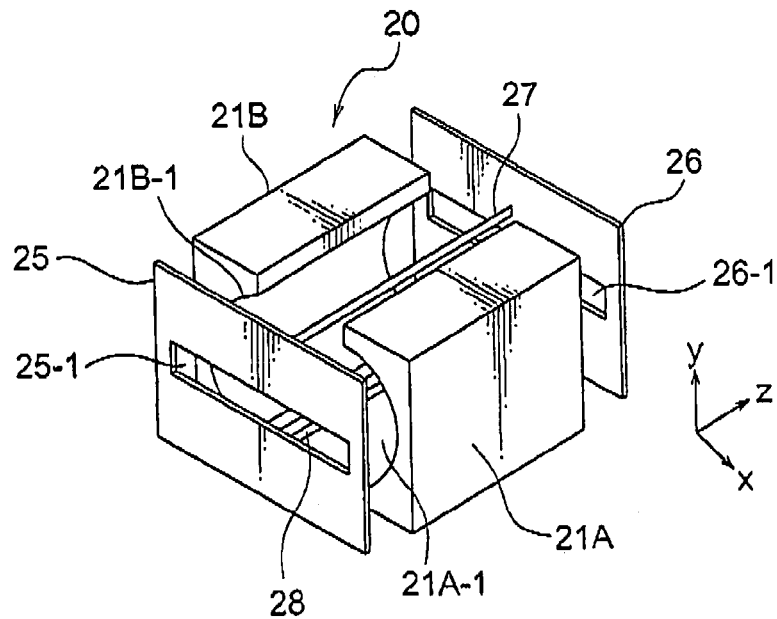
FIG. 4 is a perspective view showing a schematic structure of a beam deflection scanner according to this invention.

FIG. 4 is a perspective view showing the basic structure of the deflection scanner 20 according to this invention. The deflection scanner 20 comprises a pair of scanning electrodes 21A and 21B installed so as to be opposed to each other with the beam interposed therebetween. The deflection scanner 20 further comprises the electron suppression electrodes 25 and 26 installed near the scanning electrodes 21A and 21B on their upstream and downstream sides, respectively, so as to sandwich the scanning electrodes 21A and 21B therebetween. The deflection scanner 20 further has electric field correction electrodes 27 and 28 for zero electric field effect suppression each connected to the electron suppression electrodes 25 and 26 and provided in a space defined by opposed electrode surfaces of the scanning electrodes 21A and 21B. Herein, the electric field correction electrodes 27 and 28 are set to a negative potential equal to that of the electron suppression electrodes 25 and 26. The electron suppression electrodes 25 and 26 have laterally elongated openings 25-1 and 26-1, respectively, in a beam passing region and are applied with a DC voltage of about −1 to −2 kV.

The layout shown in FIG. 4 is only one example, i.e. the layout of the scanning electrodes 21A and 21B is not limited to the illustrated manner in which the scanning electrodes 21A and 21B are installed so as to be opposed to each other in the horizontal direction. For example, the scanning electrodes 21A and 21B may be installed so as to be opposed to each other in the vertical direction. Further, the upstream-side (front-side) and downstream-side (rear-side) electron suppression electrodes 25 and 26 do not necessarily have the same shape. For convenience, FIG. 4 shows three-dimensional x-, y-, and z-axes. The x-axis may be regarded as an axis parallel to the reciprocating scan plane of a beam, the y-axis as an axis parallel to the vertical direction, and the z-axis as an axis parallel to a beam traveling axis (the central axis in the reciprocating scan plane).

The scanning electrodes 21A and 21B are symmetrical in shape with respect to the beam traveling axis and are installed so that their surfaces on the beam traveling axis side (opposed electrode surfaces) become symmetrical with respect to the beam traveling axis. On the opposed electrode surfaces of the scanning electrodes 21A and 21B, grooves 21A-1 and 21B-1 each having a substantially circular-arc shape in cross-section are formed so as to each extend in the z-axis direction.

Figure 5A:
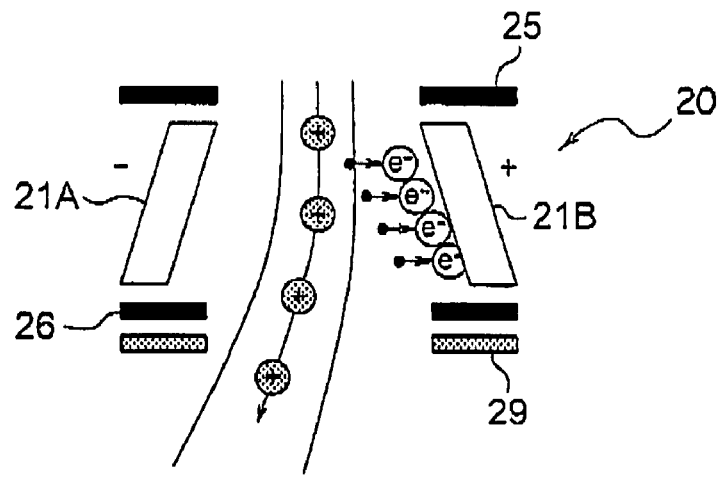
FIGS. 5A to 5C are diagrams for explaining the operation of the beam deflection scanner according to this invention.
Figure 5B:
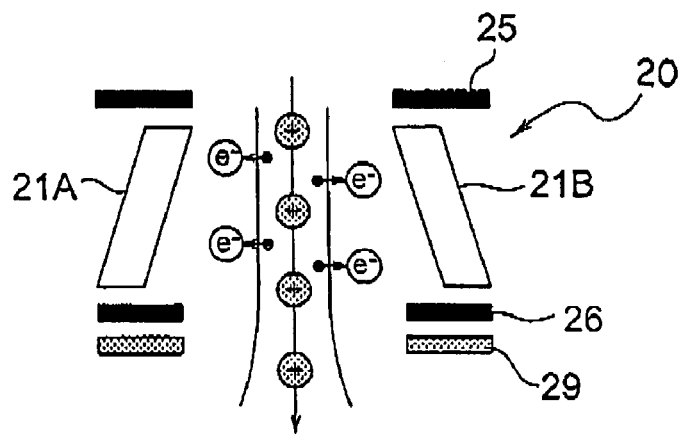
Figure 5C:
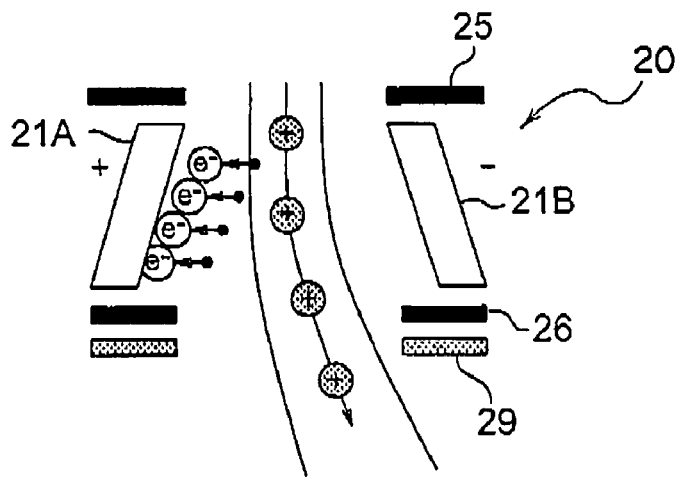
Figure 6:
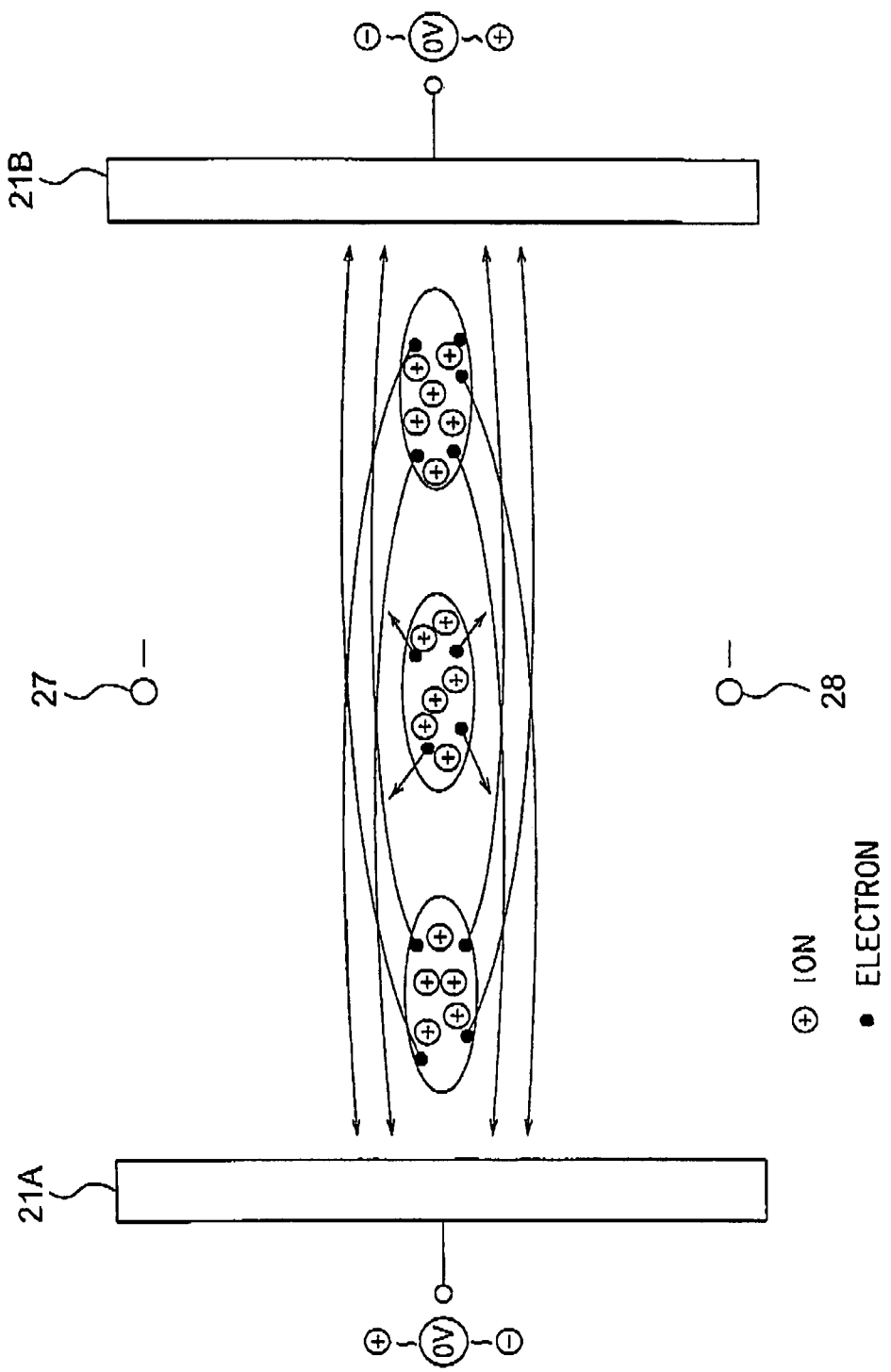
FIG. 6 is a diagram for explaining the operation of electric field correction electrodes in the beam deflection scanner according to this invention.

FIGS. 5A to 5C and FIG. 6 are diagrams for explaining the operation of zero electric field effect suppression by the deflection scanner 20 of this invention. FIGS. 5A to 5C show the deflection scanner 20 in transverse section, wherein illustration of the electric field correction electrodes is omitted. The scanning electrodes 21A and 21B are configured so that the interval between their opposed electrode surfaces gradually increases as advancing toward the downstream side. This is the layout for increasing a beam scan range. Further, a ground electrode 29 is installed adjacent to the downstream-side electron suppression electrode 26. Naturally, the ground electrode 29 is grounded. On the other hand, FIG. 6 is a diagram, as seen from the downstream side, of the deflection scanner 20. For facilitating explanation, the scanning electrodes 21A and 21B are shown in the form of flat plates parallel to each other. This means that this invention is applicable to any of the following deflection scanners. The first example is a deflection scanner in which a pair of scanning electrodes are in the form of parallel flat plates as shown in FIG. 6. The second example is a deflection scanner in which, as shown in FIGS. 5A to 5C, the interval between a pair of flat plate-shaped scanning electrodes increases as advancing toward the downstream side. The third example is a deflection scanner in which, as shown in FIG. 4, opposed electrode surfaces of a pair of scanning electrodes are each formed with a groove extending in the beam traveling axis direction (z-axis direction). The fourth example is a deflection scanner in which the interval between opposed electrode surfaces of a pair of scanning electrodes shown in FIG. 4 increases as advancing toward the downstream side. However, the configuration of the scanning electrodes shown in FIG. 4 is preferable. The reason for this will be described later.

In FIG. 5A, ions with positive charge passing through the deflection scanner 20 are attracted to the left-side scanning electrode 21A having a negative voltage. On the other hand, electrons attached to a beam are attracted to the right-side scanning electrode 21B having a positive voltage. In FIG. 6, this is shown by a beam sectional shape (oval shape) located close to the scanning electrode 21A. Accordingly, the beam passing through the deflection scanner 20 loses the electrons and thus the ions with positive charge repulse each other due to the space-charge effect, so that the beam tends to diverge. Since the mass of an electron is smaller than that of an ion, the deflection angle of the electron is greater than that of the ion.

Also in FIG. 5C, for the same reason as in FIG. 5A, an ion beam passing through the deflection scanner 20 tends to diverge. FIG. 6 shows that, in the case of a beam sectional shape (oval shape) located close to the scanning electrode 21B, electrons attached to the beam are attracted to the left-side scanning electrode 21A having the positive voltage.

On the other hand, FIG. 5B shows the state of a beam at an instant when the voltage applied across the pair of scanning electrodes 21A and 21B electrically connected to an AC scan power supply is just zero. In FIG. 6, this is shown by a beam sectional shape (oval shape) located at a middle portion between the scanning electrodes 21A and 21B. In this case, electrons attached to the beam are not attracted to the scanning electrode 21A or 21B, but are scattered in random directions, not remaining in the beam, due to negative electric fields from the electric field correction electrodes 27 and 28 exerted to the electrons most largely. This suppresses the tendency of the beam to converge due to the remaining electrons.

Figure 2A:
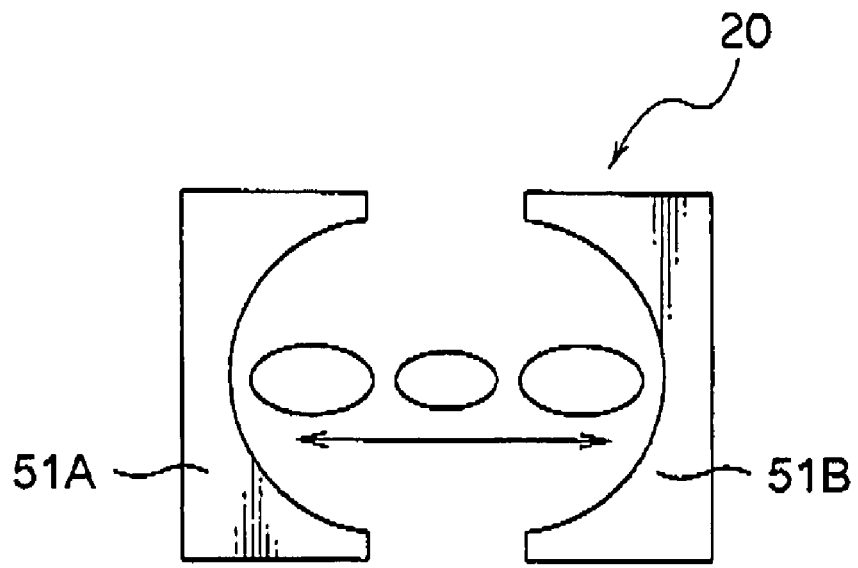
FIGS. 2A and 2B are diagrams for explaining, by comparison, the beam deflection scanner (FIG. 2A) illustrated in FIGS. 1A to 1D and a beam deflection scanner according to this invention (FIG. 2B), wherein scanning electrodes and beam cross-sectional shapes are shown as seen from the downstream side of the scanners.
Figure 2B:
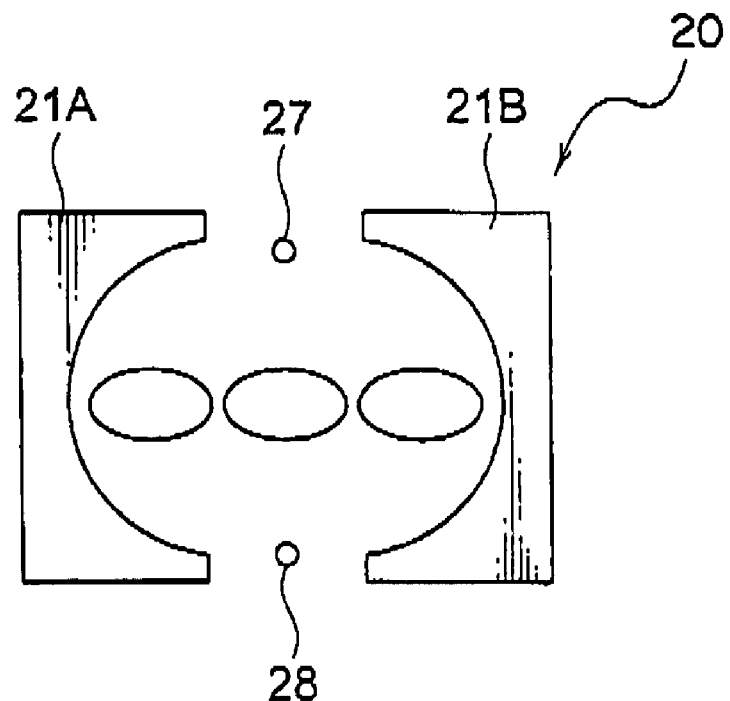

By the operation of the electric field correction electrodes 27 and 28 as described above, the beam diameter does not change at any of end portions and central portion of the scan range on the downstream side of the deflection scanner 20 and thus is constant over the scan range as shown in FIG. 2B.

The electric field correction electrodes 27 and 28 preferably have the following configuration.

1. The electric field correction electrodes 27 and 28 are installed at predetermined portions in a direction perpendicular to the reciprocating scan plane of a beam, herein at vertical predetermined portions, with the central axis of the reciprocating scan plane interposed therebetween.

2. The electric field correction electrodes 27 and 28 are installed in the space defined by the opposed electrode surfaces of the scanning electrodes 21A and 21B, with the central axis of the reciprocating scan plane interposed therebetween, in a manner to approach as much as possible a beam that performs reciprocating deflection scanning.

3. The electric field correction electrodes 27 and 28 each have a length substantially equal to that of the scanning electrode 21A, 21B with respect to the beam traveling axis.

4. The electric field correction electrodes 27 and 28 each have a cross-sectional shape that may be any shape such as an angular shape or a circular shape.

5. The electric field correction electrodes 27 and 28 are each installed between the electron suppression electrodes 25 and 26 and each connected to middle portions of the electron suppression electrodes 25 and 26.

6. The electric field correction electrodes 27 and 28 are set to a potential (correction voltage) independent of that of the electron suppression electrode 25, 26. Further, this potential is preferably variable.

In FIGS. 5A to 5C, the single electron suppression electrode 25 is adjacently installed on the upstream side of the pair of scanning electrodes 21A and 21B, while the electron suppression electrode 26 and the ground electrode 29 are adjacently installed on the downstream side thereof. However, the following configuration may be employed. Two electrodes are installed on each of the upstream and downstream sides of the pair of scanning electrodes 21A and 21B. One, closer to the scanning electrodes, of the electrodes on each of the upstream and downstream sides is used as an electron suppression electrode and applied with a DC voltage of about −1 to −2 kV. The other of the electrodes on each of the upstream and downstream sides is used as a ground electrode and grounded.

Figure 7A:
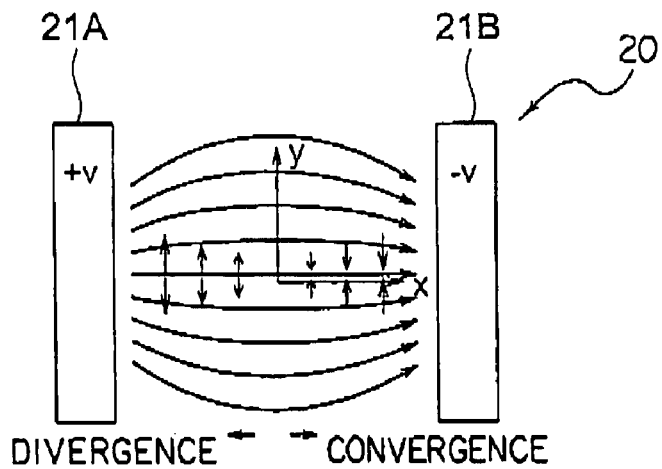
FIGS. 7A to 7C are diagrams for explaining the operations in the case where scanning electrodes of a beam deflection scanner are formed with no groove (FIG. 7A) and in the case where scanning electrodes of a beam deflection scanner are each formed with a groove (FIG. 7B).
Figure 7B:
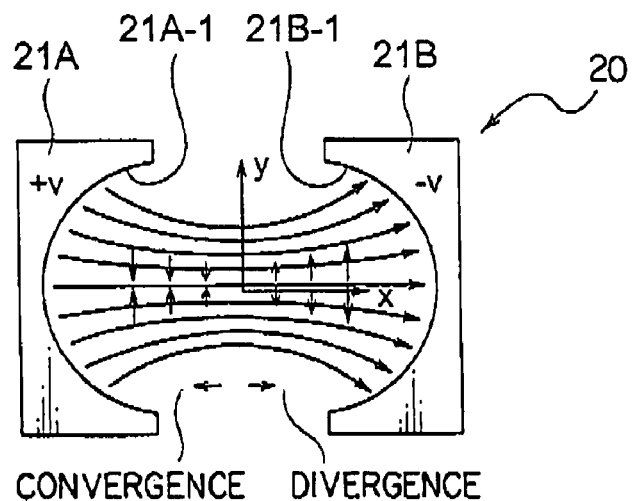
Figure 7C:
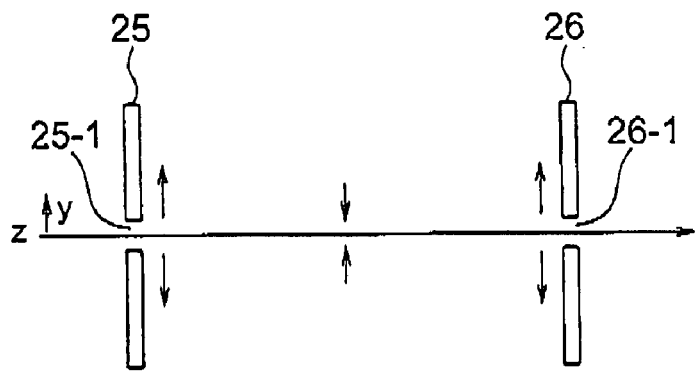

Referring now to FIGS. 7A to 7C, the significance of the grooves 21A-1 and 21B-1 in the scanning electrodes 21A and 21B will be described. These grooves contribute to suppressing vertical convergence/divergence of a beam to a small level before and after passing through the deflection scanner 20.

In a region inside the deflection scanner 20 and not near either of the upstream-side and downstream-side electron suppression electrodes, deflection electric fields produced by the scanning electrodes 21A and 21B become dominant.

Vertical components of the deflection electric fields are determined by the shape of the grooves 21A-1 and 21B-1 of the scanning electrodes 21A and 21B.

When a positive voltage +V is applied to the left-side scanning electrode and a negative voltage −V is applied to the right-side scanning electrode, the electric field distribution becomes as shown in FIG. 7A or 7B depending on the presence/absence and shape of the grooves.

In the case of the scanning electrodes 21A and 21B in the form of the parallel flat plates shown in FIG. 7A, an electric field in the y-axis direction (vertical direction) has the same directivity as that of an electric field at the opening (see FIG. 4) of each electron suppression electrode to thereby amplify the convergence/divergence of a beam in the y-axis direction.

The scanning electrodes 21A and 21B shown in FIG. 7B are formed with the proper grooves 21A-1 and 21B-1, respectively. In this case, as indicated by arrows in FIG. 7C, an electric field in the y-axis direction remote from the suppression electrodes 25 and 26 has a directivity that cancels the electric fields in the y-axis direction near the openings 25-1 and 26-1 of the suppression electrodes 25 and 26. The electric field in the y-axis direction remote from the suppression electrodes 25 and 26 is much weaker as compared with the electric fields near the openings 25-1 and 26-1 of the suppression electrodes 25 and 26, but its acting distance range is long, so that the actions of convergence and divergence become substantially equal to each other over the entire deflection scanner 20.

In the case of the scanning electrodes 21A and 21B shown in FIG. 7B, the shape and size of the grooves 21A-1 and 21B-1 are determined so that the actions of the electric fields near the openings of the suppression electrodes and the electric field in the y-axis direction (vertical direction) between the opposed electrode surfaces of the scanning electrodes 21A and 21B in the region not near the suppression electrodes have substantially the same magnitude to thereby cancel each other. This makes it possible to suppress the vertical convergence/divergence of the beam to a small level before and after passing through the deflection scanner 20. Further, the electric field can be uniformly distributed between the opposed electrode surfaces of the scanning electrodes 21A and 21B, so that the beam be deflected at substantially the same deflection angle at any portions of the oval cross-section of the beam.

According to the exemplary embodiment of this invention, the following effects are obtained by providing a pair of electric field correction electrodes adapted to suppress the zero electric field effect by largely exerting a correction electric field on a beam during deflection scanning with the beam, particularly at the time of switching between positive and negative potentials in reciprocating deflection scanning.

1. It is possible to keep the beam diameter in a scan direction substantially constant regardless of a position in a scan range, thereby being capable of reducing fluctuation in beam diameter at respective scan positions.

2. It is possible to keep the beam divergence angle in a scan direction substantially constant, thereby capable of reducing fluctuation in beam divergence angle.

3. It is possible to keep the beam current density in a scan direction substantially constant, thereby capable of reducing fluctuation in beam current density.

4. It is possible to keep the ratio of electrons to ions in a scan direction substantially constant, thereby capable of reducing fluctuation in ratio of electrons to ions contained in a beam at respective scan positions.

5. It is possible to keep the beam profile in a scan direction substantially constant, thereby capable of reducing fluctuation in beam profile.

While the present invention has thus far been described in connection with the exemplary embodiments thereof, it will readily be possible for those skilled in the art to put this invention into practice in various other manners.

What is claimed is:

1. A beam deflection scanner that performs changing periodically a beam trajectory of an ion beam or a charged particle beam which has a normal constant trajectory in a vacuum space, with reciprocating beam scanning by electrostatic deflection, said reciprocating beam scanning being made with varying scanning electric field of a pair of scanning electrodes, said beam deflection scanner comprising:

said pair of scanning electrodes installed on the beam trajectory so as to be opposed to each other with the beam trajectory, and interposed upon said beam trajectory;

and, within a zone of said scanning electric field on said beam trajectory, a pair of electric field correction electrodes which are additionally correcting the scanning electric field, said pair of electric field correction electrodes being installed in a direction perpendicular to an opposing direction of said pair of scanning electrodes interposed said zone in which said pair of scanning electrodes are installed and extending along a beam traveling axis within the substantially equal length of said zone, wherein said pair of electric field correction electrodes are installed with a central axis of a reciprocating scan plane of the ion beam or the charged particle beam interposed upon said beam trajectory, wherein positive and negative potentials are alternately applied to said pair of scanning electrodes, while some correction voltage is constantly applied to each electrode of said pair of electric field correction electrodes, wherein said pair of electric field correction electrodes each have thin rod structure, which generate narrow electric field towards a beam axis direction, and said correction electric field produced by said pair of electric field correction electrodes is especially exerted on the ion beam or charged particle beam passing between said pair of scanning electrodes at the time of switching between said positive and negative potentials.

2. The beam deflection scanner according to claim 1, wherein said pair of electric field correction electrodes are installed in a space defined by opposed surfaces of said pair of scanning electrodes, with a central axis of a reciprocating scan plane of the ion beam or the charged particle beam interposed therebetween, closely adjacent the ion beam or the charged particle beam.

3. The beam deflection scanner according to claim 1, wherein said pair of electric field correction electrodes each have an angular or circular cross-sectional shape.

4. The beam deflection scanner according to claim 1, further comprising a front-side electron suppression electrode and a rear-side electron suppression electrode installed adjacent to said pair of scanning electrodes on their upstream side and downstream side, respectively,
wherein said pair of electric field correction electrodes are set to a potential equal to that of said front-side electron suppression electrode and said rear-side electron suppression electrode.

5. The beam deflection scanner according to claim 1, further comprising a front-side electron suppression electrode and a rear-side electron suppression electrode installed adjacent to said pair of scanning electrodes on their upstream side and downstream side, respectively,
wherein said pair of electric field correction electrodes are each installed between said front-side electron suppression electrode and said rear-side electron suppression electrode and each connected to middle portions of said front-side electron suppression electrode and said rear-side electron suppression electrode.

6. The beam deflection scanner according to claim 1, further comprising a front-side electron suppression electrode and a rear-side electron suppression electrode installed adjacent to said pair of scanning electrodes on their upstream side and downstream side, respectively,
wherein said pair of electric field correction electrodes are applied with a potential independent of that of said front-side electron suppression electrode and said rear-side electron suppression electrode.

7. The beam deflection scanner according to claim 1, further comprising a front-side electron suppression electrode and a rear-side electron suppression electrode installed adjacent to said pair of scanning electrodes on their upstream side and downstream side, respectively,
wherein said pair of electric field correction electrodes are applied with a variable potential independent of that of said front-side electron suppression electrode and said rear-side electron suppression electrode.

8. The beam deflection scanner according to claim 1, wherein the ion beam or the charged particle beam passing between said pair of scanning electrodes has an oval cross-sectional shape in which a cross-sectional size with respect to the opposing direction of said pair of scanning electrodes is larger than a cross-sectional size with respect to the direction perpendicular to said opposing direction.

9. The beam deflection scanner according to claim 8, wherein said pair of scanning electrodes provide a uniform electric field distribution so that any portions of a cross-section in the ion beam or the charged particle beam having the oval cross-sectional shape have substantially the same deflection angle.

10. An ion implantation system comprising the beam deflection scanner according to claim 1.

11. A beam deflection scanning method that performs changing periodically a beam trajectory of an ion beam or a charged particle beam which has a normal constant trajectory in a vacuum space, with reciprocating beam scanning by electrostatic deflection, said reciprocating beam scanning being made with varying scanning electric field of a pair of scanning electrodes, said beam deflection scanning method comprising:
performing said reciprocating deflection scanning by switching between positive and negative potentials applied to said pair of scanning electrodes opposed to each other; and
exerting, at the time of switching between said positive and negative potentials, a correction electric field on the ion beam or the charged particle beam passing between said pair of scanning electrodes using a pair of electric field correction electrodes installed between said pair of scanning electrodes so as to be opposed to each other, said pair of electric field correction electrodes being for additionally correcting the scanning electric field and being installed, within a zone of said scanning electric field on said beam trajectory, in a direction perpendicular to an opposing direction of said pair of scanning electrodes interposed said zone in which said pair of scanning electrodes are installed and extending along a beam traveling axis within the substantially equal length of said zone, said pair of electric field correction electrodes each having thin rod structure and generating narrow electric field towards a beam axis direction.

12. The beam deflection scanning method according to claim 11, wherein said pair of electric field correction electrodes are set to a potential equal to that of a front-side electron suppression electrode and a rear-side electron suppression electrode installed adjacent to said pair of scanning electrodes on their upstream side and downstream side, respectively.

13. The beam deflection scanning method according to claim 11, wherein said pair of electric field correction electrodes are applied with a potential independent of that of a front-side electron suppression electrode and a rear-side electron suppression electrode installed adjacent to said pair of scanning electrodes on their upstream side and downstream side, respectively.

14. The beam deflection scanning method according to claim 11, wherein said pair of electric field correction electrodes are applied with a variable potential independent of that of a front-side electron suppression electrode and a rear-side electron suppression electrode installed adjacent to said pair of scanning electrodes on their upstream side and downstream side, respectively.

15. An ion implantation method using the beam deflection scanning method according to claim 11.

* * * * *